United States Patent [19]

Bosselaar

[11] 3,763,406

[45] Oct. 2, 1973

[54] GUARD JUNCTION FOR SEMICONDUCTOR DEVICES

[75] Inventor: Cornelis Albertus Bosselaar, Nijmegen, Netherlands

[73] Assignee: U.S. Philips Corporation, New York, N.Y.

[22] Filed: Nov. 17, 1971

[21] Appl. No.: 199,600

Related U.S. Application Data

[63] Continuation of Ser. No. 21,443, March 20, 1970, abandoned.

[52] U.S. Cl. ........................ 317/235 R, 317/235 AH
[51] Int. Cl. ............................................ H01l 11/06
[58] Field of Search ............ 317/235, 235 A, 235 B, 317/235 G, 234 Q, 234 UA

[56] References Cited

UNITED STATES PATENTS 3,391,287 7/1968 Kao et al. ........................... 317/235
3,405,329 10/1968 Loro et al. .......................... 317/235

*Primary Examiner*—Jerry D. Craig
*Attorney*—Frank R. Trifari

[57] ABSTRACT

A semiconductor device comprising semiconductor body containing a first zone of a first conductivity type surrounding a second zone of a second conductivity type to form a first p-n junction; at least one further zone of the second conductivity type surrounded by the first zone to form a second p-n junction; an insulating layer on the surface of the semiconductor body; a contact layer extending through an opening in the insulating layer to the second zone and a conductive layer extending through another such opening to the further zone, the other opening being spaced from the outer periphery of the further zone.

16 Claims, 5 Drawing Figures

Patented Oct. 2, 1973 3,763,406

2 Sheets-Sheet 1

Figure 1:
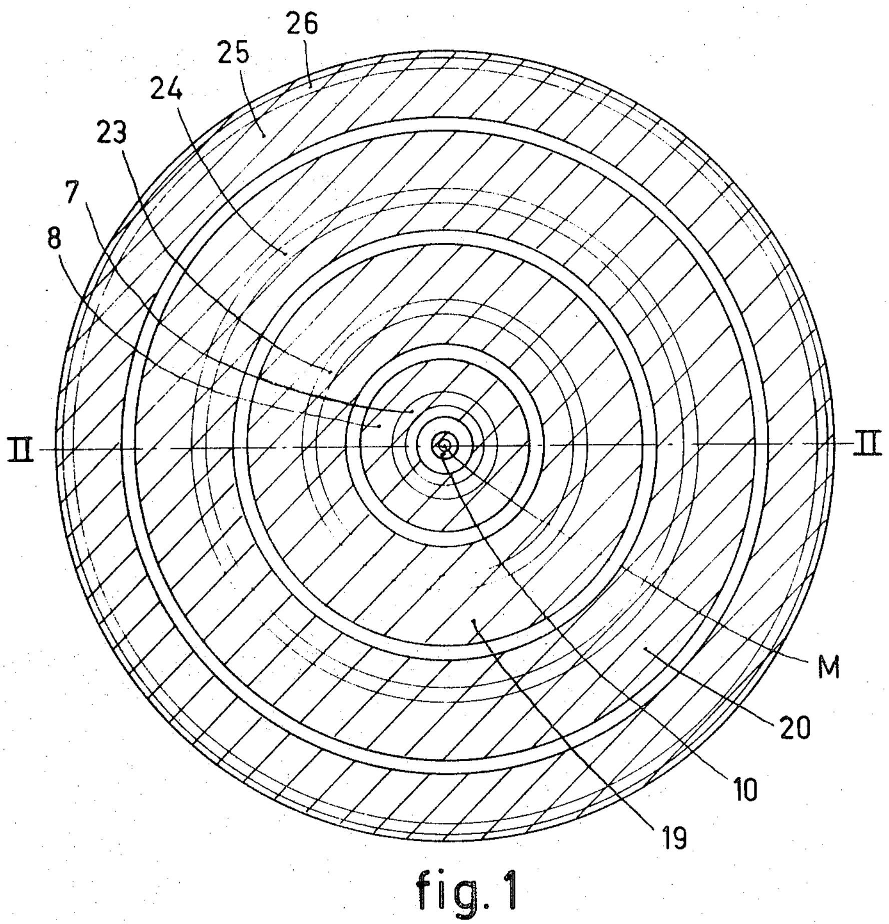

INVENTOR.
CORNELIS A. BOSSELAAR

BY

[signature]

AGENT

INVENTOR.
CORNELIS A. BOSSELAAR
BY
[signature]
AGENT

GUARD JUNCTION FOR SEMICONDUCTOR DEVICES

This is a continuation of application Ser. No. 21,443, filed Mar. 20, 1970 now abandoned.

The invention relates to a semiconductor device having a semiconductor body comprising a first zone of a first conductivity type adjoining a substantially flat surface of the body, a second zone of a second conductivity type adjoining said surface and surrounded entirely by the first zone within the semiconductor body, in which the p-n junction between the first and the second zone terminates at the said surface, and at least one further zone of the second conductivity type situated beside the second zone, adjoining said surface, and fully surrounded by the first zone within the semiconductor body, in which the p-n junction between the first and the further zone terminates at said surface, and in which the further zone surrounds the second zone, an insulating layer being present on said flat surface and comprising a contact window in which a contact layer is provided on the second zone.

Such a semiconductor device is known, for example, from French Pat. specification No. 1,421,136. In this device the second zone is surrounded by one or more further zones, each following further zone surrounding the second zone and all the preceding further zones. By using such further zones of the second conductivity type it has been possible to increase the breakdown voltage between the first and the second zone considerably by decreasing the influence of the surface conditions on said breakdown voltage.

It has been found, however, that in circumstances such devices are not stable since during operation of the device in which the p-n junction between the first and the second zone is biased in the reverse direction, the insulating layer is charged electrically and tends to assume the potential of the contact layer. As a result of this a surface layer of the second conductivity type, a so-called inversion layer, can be induced in the first zone which inversion layer connects the further zones to the second zone as well as mutually, so that the effect of the said further zones is obviated and the breakdown voltage between the first and the second zone decreases.

Another cause of instability and reduction of the breakdown voltage may be that the junctions between regions of p-type and n-type doping contain crystal defects which may give rise to reduction of the breakdown field strength of the p-n junctions present.

One of the objects of the invention is to remove the drawbacks occurring in known devices or at least reduce them considerably.

The invention is inter alia based on the recognition of the fact that, by connecting at least one of the further zones to a metal layer situated on the insulating layer, the electric properties of the device can be improved.

Therefore, according to the invention, a device of the type mentioned in the preamble is characterized in that at least one conductive layer which substantially entirely surrounds the contact layer is present on the insulating layer and is connected, via an aperture in the insulating layer, to a surface part of a further zone, said surface part being situated at a distance from the outer circumference of said further zone, the part of the conductive layer situated on the insulating layer extending to above the first zone substantially along the whole inner circumference and/or substantially along the whole outer circumference of the further zone.

By providing a conductive layer according to the invention, the breakdown voltage between the first and the second zone and the stability of the device can be essentially increased as will be explained in detail below.

Of great importance in this connection is the recognition of the fact that the current which, in the operating condition, flows along the semiconductor surface in the reverse direction across the p-n junction between the first and the second zone, causes the side facing the second zone, the inner side, of the p-n junction between a further zone and the first zone to be polarized in the forward direction, while said p-n junction is polarized in the reverse direction on the outside of the further zone. As a result of this the electric field across the depletion layer on the inside of the p-n junction between said further zone and the first zone becomes substantially zero and the conductive layer connected to said further zone assumes substantially the potential of the part of the first zone adjoining the inside of the further zone.

In connection herewith, an important preferred embodiment of the device according to the invention is characterized in that, measured parallel to the surface, the distance from the contact layer to the conductive layer is smaller than the distance from the contact layer to the further zone and smaller than the distance from the contact layer to the aperture. The conductive layer which, in accordance with the above, has substantially the potential of the part of the first zone adjoining the inner circumference of the further zone, extends in this preferred embodiment over the said inner circumference to above the first zone. As a result of this, said conductive layer can operate as a field correction electrode and gives rise to such a field distribution across the insulating layer that as a result of this the formation of an inversion layer is counteracted or, if such an inversion layer should already be present without voltages having been applied, extension thereof is prevented. Since, however, the p-n junction between the further zone and the first zone on the outside of the further zone is also polarized in the reverse direction, the overall reverse voltage between the first and the second zone will distribute at the surface between the further zones present, the voltage between a conductive layer and the first and second zones, respectively, remaining comparatively low. As a result of this a very important increase of the breakdown voltage and of the permissible operating voltage is obtained.

The aperture in the insulating layer through which the conductive layer is connected to the further zone may also extend, if desirable, over a part of the first zone so that the p-n junction between the further zone and the first zone on the inner circumference of the further zone is shortcircuited by the conductive layer.

The surface part of the further zone to which the conductive layer is connected preferably surrounds the contact layer substantially entirely.

An inversion layer, if any, which is formed on the outside of the outermost further zone will nevertheless give rise there to breakdown at the surface although at much higher voltages between the first and the second zone than in the absence of the further zones. In order to prevent this, according to an important preferred embodiment a further conductive layer is present on the insulating layer. The conductive layer surrounds said conductive layers substantially entirely and is connected electrically to a surface part of the first zone via an aperture in the insulating layer, the distance, measured parallel to the surface, from the contact layer to the said further conductive layer being smaller than to the surface part which preferably surrounds the further zones substantially entirely. This further conductive layer may again operate as a field correction electrode, and hence counteract the formation of an inversion layer, while on the outside of said further conductive layer no inversion channel is induced.

In order to obtain a good electric contact with the first zone, the further conductive layer is preferably connected to a contact zone of the first conductivity type adjoining the surface, which contact zone is provided in the first zone and has a lower resistivity than the first zone and substantially entirely surrounds the said further zones.

In order to avoid an undesirable capacitance between the second zone and the conductive layers, another preferred embodiment according to the invention is characterized in that the conductive layer or layers surrounds or surround the second zone and extends or extend only beyond said zone.

A further important preferred embodiment according to the invention is characterized in that of at least one conductive layer, measured parallel to the surface, the distance from the contact layer to the outer circumference of said conductive layer is larger than the distance from the contact layer to the outer circumference of the further zone connected to said conductive layer. Viewed from the second zone, said conductive layer thus extends beyond the said further zone. Since in the operating condition, the p-n junction between the further zone and the first zone on the outside of the further zone is polarized in the reverse direction, this part of the conductive layer projecting beyond the further zone can induce an inversion layer in the underlying region of the first zone or cause at least such a field distribution that the maximum field strength at the surface occurs at a distance from the junction between the further zone and the first zone, which junction in general comprises crystal defects which may give rise to a decrease of the breakdown field strength.

Viewed from the second zone, all the conductive layers will preferably extend beyond the further zone to which they are connected. Moreover, the first contact layer will advantageously be chosen to be large so that it extends to above the first zone. As a result of this the place having the highest field strength at the surface in the p-n junction between the first and the second zone will be moved to some distance from the p-n junction with the above-described advantages.

By means of the above-described measure a very high value of the breakdown voltage between the first and the second zone can be obtained which is determined substantially only by the doping of the semiconductor material, at least if no spontaneous inversion layer, which layer is also present in the absence of applied voltages, is formed at the semiconductor surface.

If, however, such a spontaneous inversion layer should be present, the conductive layers connected to the further zones are not capable of effectively interrupting the leakage paths formed by the inversion channels. An important further preferred embodiment according to the invention is therefore characterized in that, in order to interrupt such a leakage path, a surface zone of the first conductivity type having a lower resistivity than the first zone is provided beside at least one further zone on the side of the contact layer, said surface zone substantially entirely surrounding the contact layer while, measured parallel to the surface, the distance from the contact layer to the conductive layer connected to the further zone is smaller than the distance from the contact layer to the surface zone. The surface zone of the first conductivity type can be provided at some distance from the further zone. Preferably, however, the surface zone will adjoin the further zone. According to an important preferred embodiment the p-n junction between the surface zone and the further zone is covered at least partly and is substantially short circuited at the surface by the conductive layer connected to said further zone.

The last-mentioned preferred embodiments are of particular interest in the case in which the first zone consists of p-type silicon, since the spontaneous inversion layers are easily formed on said material, for example, as a result of thermal oxidation, as is conventional in manufacturing planar structures.

Furthermore, the invention is of particular importance in a device in which the first zone is the collector zone and the second zone is the base zone of a high voltage transistor.

The invention furthermore relates to a semiconductor device as described above in which means are present for applying such potentials to the first and the second zone that the p-n junction between said zones is biased in the reverse direction at least temporarily.

Figure 2:
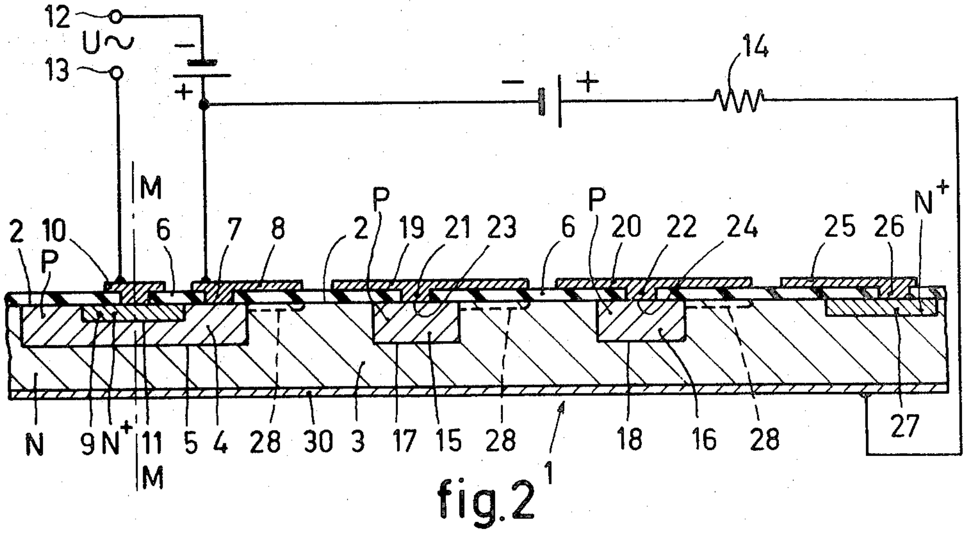

In order that the invention may be readily carried into effect, a few examples will now be described in greater detail, by way of example, with reference to the accompanying drawings, in which:

FIG. 1 is a diagrammatic plan view of a semiconductor device according to the invention, FIG. 2 is a diagrammatic cross-sectional view taken on the line II—II of FIG. 1.

Figure 3:
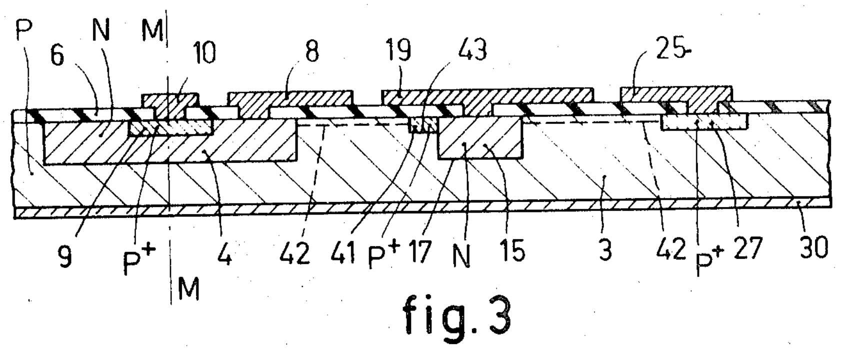
Figure 4:
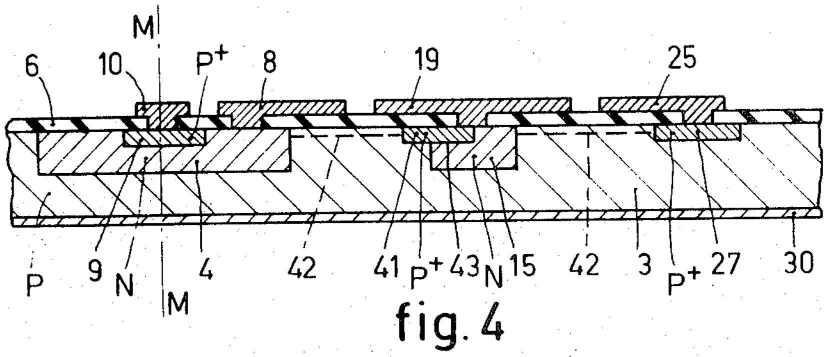
Figure 5:
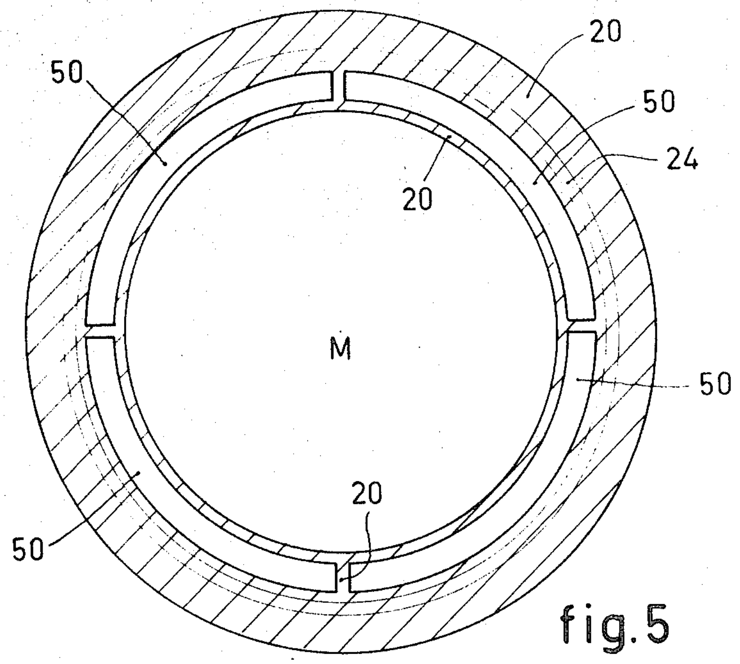

FIGS. 3 and 4 are diagrammatic cross-sectional views of other devices according to the invention, and FIG. 5 is a special embodiment of the layer 20 of the device shown in FIGS. 1 and 2.

The FIGS. 1 to 5 are not drawn to scale and particularly the dimensions in the direction of the thickness are strongly exaggerated for clarity. In the plan views shown in FIGS. 1 and 5, the metal layers are shaded. Like components are referred to by like numerals.

FIG. 1 is a plan view and FIG. 2 is a diagrammatic cross-sectional view taken on the line II—II of FIG. 1 of a part of a semiconductor device according to the invention. The device is rotationally symmetric about the line M—M of FIG. 2.

The device, in the present case a transistor, comprises a semiconductor body 1 of silicon, see FIG. 2, having a substantially flat surface 2. A first n-type conductive zone 3 and a second p-type conductive zone 4 which, within the semiconductor body, is fully surrounded by the zone 3 adjoin said surface 2. The p-n junction 5 between the zones 3 and 4 terminates at the surface 2.

On the flat surface 2 an insulating layer 6 of silicon oxide is provided having a contact window 7 in which an aluminium contact layer 8 is provided on the second zone 4.

The device shown in FIGS. 1 and 2 furthermore comprises an n-type zone 9 which is connected to an aluminium layer 10 via an aperture in the oxide layer 6. The zone 9 forms the emitter zone, the zone 4 forms the base zone, and the zone 3 forms the collector zone of a transistor. A metal layer 30 makes a substantially ohmic contact with the collector zone 3. In the operating condition, as diagrammatically shown in FIG. 2, the p-n junction 5 between the zones 3 and 4 is biased in the reverse direction, while the p-n junction 11 between the zones 4 and 9 is biased in the forward direction. A signal U is supplied to the emitter between the terminals 12 and 13, which signal can be derived in amplified condition from the collector, for example, through the resistor 14.

In order to increase the collector breakdown voltage, the device furthermore comprises two further p-type zones 15 and 16 situated beside the second zone 4, which zones adjoin the surface 2 and are each surrounded, within the semiconductor body, entirely by the first zone 3. The p-n junctions 17 and 18 between the zone 3 and the zones 15 and 16 likewise terminate at the surface 2. The zones 15 and 16 both surround the second zone 4.

It has been found in practice that the collector breakdown voltage of the transistor thus formed is not stable since during operation the oxide layer 6 is charged electrically. As a result of this, a p-type conductive layer, an inversion layer, can be formed in the n-type zone 3 at the surface, which layer connects the zones 15 and 16 together and also to the second zone 4. As a result of this, the effect of the zones 15 and 16 is obviated so that the breakdown voltage between the zones 3 and 4 decreases.

In order to prevent this decrease of the collector breakdown voltage, according to the invention two mutually separated electrically conductive layers 19 and 20 of aluminium are provided on the oxide layer 6 and surround the contact layer 8 and are connected, via apertures 21 and 22 in the oxide layer 6, to surface parts 23 and 24 of the further zones 15 and 16, which surface parts surround the contact layer 8 and are situated at a distance from the outer circumference of the further zones 15 and 16. Measured parallel to the surface 2, the distance from the contact layer 8 to the conductive layer 19 is smaller than the distance from the contact layer 8 to the zone 15 and also smaller than the distance from the contact layer 8 to the aperture 21. The same holds good with respect to the mutual distances of the contact layer 8, the conductive layer 20, the zone 16 and the aperture 22.

Since in the operating condition a certain reverse current flows through the semiconductor body along the surface 2 (conventionally reckoned from zone 3 to zone 4) each of the p-n junctions 17 and 18 on the inside of the associated zones 15 and 16 is polarized in the forward direction, while the said p-n junctions on the outside of the zones 15 and 16 are polarized in the reverse direction. The layers 19 and 20 hence assume substantially the potential of those underlying parts of the zone 3 which adjoin the inside of the zones 15 and 16. The conductive layers 19 and 20 thus give rise to such a field distribution over the insulating layer that the formation of an inversion layer as described above is thereby counteracted. The overall reverse voltage between the zones 3 and 4 can now be distributed to p-n junction 5, and p-n junctions 17 and 18 which are polarized in the reverse direction on the outside. As a result of this voltage distribution, the maximum field strength at the surface is kept comparatively low, while the potential difference between the layers 19 and 20 and the zones 3 and 4 also remains comparatively low. As a result of this the breakdown voltage between the zones 3 and 4 and hence the admissible collector voltage is very high.

In this example the apertures 21 and 22 through which the layers 19 and 20 are connected to the zones 15 and 16, are situated entirely within said zones. Since in the operating condition the p-n junctions 17 and 18 on the inside of the zones 15 and 16 are polarized in the forward direction, the apertures 21 and 22 may also extend, if desirable, to over the inner circumference of the zones 15 and 16, so that on this side the p-n junctions 17 and 18 are shortcircuited by the layers 19 and 20.

Provided on the oxide layer 6 is a further conductive layer in the form of an aluminium layer 25 which surrounds the conductive layers 29 and 20 and is connected electrically, via an aperture 26 in the oxide layer 6, to a diffused n-type contact zone 27 associated with the zone 3 and having a lower resistivity than the zone 3. Measured parallel to the surface 2, the distance from the contact layer 8 to the further conductive layer 25 is smaller than the distance from the contact layer 8 to the zone 27 which fully surrounds the zones 15 and 16. The layer 25, as well as the layers 19 and 20 on the inside of the zones 15 and 16, can operate as a field correction electrode and thus counteract the formation of an inversion layer on the underlying semiconductor surface. The contact zone 27 which is more strongly doped than the reamainder of the zone 3, moveover prevents the formation of an inverson layer outside the layer 25 and serves as a channel stopper.

Since the layers 19 and 20 do not extend above the zone 4, undesirable capacities and undesirably high voltage differences across the oxide layer 6 are avoided.

The conductive layers 19 and 20 extend on the outside of the zones 15 and 16 to above the zone 3 and also the contact layer 8 extends to above the zone 3. As a result of this and in the polarisation condition described, an inversion layer 28 (shown in broken lines in FIG. 2) can be induced below said projecting part of the layers 8, 19 and 20 in the underlying region of the zone 3, or at least such a field distribution can be caused that the maximum field strength at the surface occurs at a distance from the p-n junctions 5, 17 and 18 where in general crystal defects are present which might reduce the breakdown voltage.

As already stated, the device is rotationally symmetric about the line M—M. The dimensions are as follows:

| | RADIUS Inner Circumference μm | RADIUS Outer Circumference μm |
|---|---|---|
| zone | | |
| 15 | 190 | 220 |
| 16 | 310 | 340 |
| 27 | 430 | 460 |
| layer | | |
| 8 | 60 | 150 |
| 19 | 170 | 270 |
| 20 | 290 | 390 |
| 25 | 410 | 450 |

The zone 4 has a diameter of 200 μum, the zone 9 of 100 μum.

The zone 3 has a resistivity of 35 ohm-cm. The zones 4, 15 and 16 have a thickness of approximately 10 μum and a surface concentration of $10^{18}$ at/ccm$^3$ and have been obtained simultaneously by the diffusion of boron. The zones 9 and 27 have a thickness of approximately 6 μum and a surface concentration of $10^{20}$ at/ccm$^3$ and have been obtained simultaneously by the diffusion of phosphorus. The thickness of the oxide layer 6 is approximately 1 μum, that of the aluminium layers approximately 0.5 μum.

It will be obvious that the device according to the invention need by no means be rotationally symmetric. For example, one or more zones or metal layers may be square, rectangular, oval, and so on, the intermediate spaces between the various metal layers and the mutual distance between the zones along their entire circumference being preferably chosen to be equal. Nor need the dopings and thicknesses of zones of the same conductivity type be mutually equal. Furthermore, the emitter and base zones can conventionnally be constructed as interdigital zones.

The transistor shown in FIGS. 1 and 2 has a high collector-base breakdown voltage which is limited theoretically only by the doping of the zone 3 corresponding to a breakdown voltage of approximately 1,000 volts.

Other semiconductor devices according to the invention are shown in FIGS. 3 and 4. These devices differ from the device shown in FIGS. 1 and 2 in several respects. First of all, only the zone 15 and not the zone 16 is present so that the overall reverse voltage between the zones 3 and 4 is distributed over one stage less. Furthermore, the conductivity types of the various zones are reversed, that is to say the zones 3, 9 and 27 are p-type conductive and the zones 4 and 15 are n-type conductive. Whereas in general an inversion channel is not spontaneously formed at the boundary surface between the zone 3 and the oxide layer 6 when the zone 3 is n-type conductive, such an inversion channel can be formed indeed at the surface of the p-type zone 3 in a device as shown in FIG. 3 or 4.

Such an inversion channel which is also present in the absence of polarisation voltages, in general, can not be eliminated entirely by the aluminium layer 19. Therefore, in the constructions shown in FIGS. 3 and 4, a diffused p-type conductive surface zone 41 is present which adjoins the inside of the zone 15 and has a lower resistivity than the zone 3. Like the device shown in FIGS. 1 and 2, the devices shown in FIGS. 3 and 4 are rotationally symmetric about the line M—M so that the zone 41 surrounds the contact layer 8. The zone 41 serves as a channel stopper, while the part of the layer 19 situated on the side of the contact layer 8 above the zone 3 operates as a field correction electrode and ensures that the inversion layer 42 (shown in broken lines) is not further reinforced under the influence of charge displacements in or near the oxide layer 6. The p-n junction 43 between the zones 15 and 41 in FIG. 4 is shortcircuited by the layer 19 so that no undesirable potential difference can occur across the junction 43 while also the available space is used as effectively as possible.

In the above described devices large portions of the surface are covered with metal. In connection with holes in the oxide layer which sometimes occur, a danger of undesirable shortcircuit with the underlying semiconductor regions may result in circumstances. This danger will be strongly reduced by providing the metal layers with apertures or recesses at such places that the effect of the conductive layers is maintained thereby. FIG. 5 shows such a brokenaway construction by way of example for the conductive layer 20 (compare FIG. 1). On the inside of the layer 20 apertures 50 are provided. The outside of the layer 20 will preferably not be apertured so as to maintain the induced channels 28 (see FIG. 2) everywhere.

It will be obvious that the invention is not restricted to the examples described. Particularly the invention is not restriced to transistors, but may equally be applied to increase the breakdown voltage of p-n junctions in other semiconductor devices. For example, a diode according to the invention is obtained by omitting the zone 9 and the contact layer 10.

Furthermore, the construction shown in FIGS. 3 and 4 may advantageously be used also if the zones 3, 9 and 27 are n-type conductive and the zones 4 and 15 are p-type conductive. One or more of the conductive layers can extend, if desirable, only along the outer circumference of the associated further zone to above the first zone. As a semiconductor material may be used semiconductors other than silicon, for example, germanium or III–V compounds. Instead of silicon oxide, the insulating layer 6 may comprise other materials, for example, silicon nitride, or several layers of different materials situated one on top of the other. The aluminium layers may be replaced by other metals. The zone 41 may be provided at a distance from the zone 15, if desirable. The shape and dimensions of the device, as well as the dopings may be varied within wide limits without departing from the scope of the present invention. In particular, the conductivity types of the various zones may all be replaced by their opposite conductivity types while reversing the applied bias voltages.

I claim:

1. A semiconductor device having a semiconductor body comprising a first zone of a first conductivity type adjoining a substantially flat surface of the semiconductor body, a second zone of a second conductivity type adjoining said surface and being entirely surrounded by the first zone within the semiconductor body to form between the first and second zones a first p-n junction which terminates at said surface, at least one further zone of the second conductivity type situated beside the second zone, said further zone adjoining said surface and being entirely surrounded by the first zone within the semiconductor body to form between the first and the further zones a second p-n junction which terminates at said surface, an insulating layer disposed on said surface and having a contact window and an aperture, a contact layer disposed on the insulating layer and connected through said window to the second zone, and at least one conductive layer on the insulating layer which substantially surrounds the contact layer and is conductively connected to a surface part of the further zone through said aperture in the insulating layer, said further zone having an inner periphery and an outer periphery, said inner periphery being located closer to said contact layer than said outer periphery, said surface part being spaced from the outer periphery of the further zone, said conductive layer situated on the insulating layer extending to above the first zone substantially along the entire outer periphery of the further zone, said conductive layer being unconnected to an external circuit so that said conductive layer is at floating potential.

2. A semiconductor device having a semiconductor body comprising a first zone of a first conductivity type adjoining a substantially flat surface of the semiconductor body, a second zone of a second conductivity type adjoining said surface and being entirely surrounded by the first zone within the semiconductor body to form between the first and second zones a first p-n junction which terminates at said surface, at least one further zone of the second conductivity type situated beside the second zone, said further zone adjoining said surface and being entirely surrounded by the first zone within the semiconductor body to form between the first zone and the further zone a second p-n junction which terminates at said surface, an insulating layer disposed on said surface and having a contact window and an aperture, a contact layer disposed on the insulating layer and connected through said window to the second zone, and at least one conductive layer on the insulating layer which substantially surrounds the contact layer and is conductively connected to a surface part of the further zone through said aperture in the insulating layer, said further zone having an inner periphery and an outer periphery, said inner periphery being located closer to said contact layer than said outer periphery, said conductive layer situated on the insulating layer extending to above the first zone along substantially entirely both the inner and outer peripheries of the further zone, said conductive layer being unconnected to an external circuit so that said conductive layer is at floating potential.

3. A semiconductor device having a semiconductor body comprising a first zone of a first conductivity type adjoining a substantially flat surface of the semiconductor body, a second zone of a second conductivity type adjoining said surface and being entirely surrounded by the first zone within the semiconductor body to form between the first and second zones a first p-n junction which terminates at said surface, at least one further zone of the second conductivity type situated beside the second zone, said further zone adjoining said surface and being entirely surrounded by the first zone within the semiconductor body to form between the first zone and the further zone a second p-n junction which terminates at said surface, an insulating layer disposed on said surface and having a contact window and an aperture, a contact layer disposed on the insulating layer and connected through said window to the second zone, and at least one conductive layer on the insulating layer which substantially surrounds the contact layer and is conductively connected to a surface part of the further zone through said aperture in the insulating layer, said further zone having an inner periphery and an outer periphery, said inner periphery being located closer to said contact layer than said outer periphery, said surface part being spaced from the outer periphery of the further zone, said conductive layer situated on the insulating layer extending to above the first zone substantially along the entire inner periphery of the further zone, said conductive layer being unconnected to an external circuit so that said conductive layer is at floating potential.

4. A semiconductor device as claimed in claim 3, wherein the distance measured along a line parallel to the surface from the contact layer to the conductive layer is smaller than a distance along the line from the contact layer to the further zone and smaller than a distance along the line from the contact layer to the aperture.

5. A semiconductor device as claimed in claim 3, wherein the surface part of the further zone substantially entirely surrounds the contact layer.

6. A semiconductor device as claimed in claim 3, wherein a second conductive layer is present on the insulating layer and substantially entirely surrounds the first conductive layer and is electrically connected through an aperture in the insulating layer to a surface part of the first zone in which, measured parallel to the surface, a distance along a line from the contact layer to the second conductive layer is smaller than a distance along the line to the surface part of the first zone.

7. A semiconductor device as claimed in claim 6, wherein the surface part of the first zone substantially entirely surrounds the further zone.

8. A semiconductor device as claimed in claim 6, wherein the second conductive layer is connected to a contact zone of the first conductive type adjoining the surface, said contact zone is provided in the first zone and has a lower resistivity than the first zone and substantially entirely surrounds the further zone.

9. A semiconductor device as claimed in claim 3, wherein the inner periphery of the conductive layer is more closely disposed to the contact layer than is the inner periphery of said further zone and a distance along a line parallel to the surface from the contact layer to the outer periphery of the conductive layer is greater than a distance along the line from the contact layer to the outer periphery of the further zone.

10. A semiconductor device as claimed in claim 3, wherein the contact layer extends to above the first zone.

11. A semiconductor device as claimed in claim 3, wherein s surface zone of the first conductivity type having a lower resistivity than the first zone is present beside at least one further zone on the side of the contact layer, said surface zone substantially entirely surrounding the contact layer, while, measured parallel to the surface, a distance along a line from the contact layer to the conductive layer connected to the further zone is smaller than a distance along the line from the contact layer to the surface zone.

12. A semiconductor device as claimed in claim 11, wherein the surface zone of the first conductivity type adjoins the further zone.

13. A semiconductor device as claimed in claim 3, wherein the second p-n junction is at least partly covered and is substantially shortcircuited at the surface by the conductive layer.

14. A semiconductor device as claimed in claim 3, wherein the first zone consists of p-type silicon.

15. A semiconductor device as claimed in claim 3, wherein the first zone is the collector zone of a transistor and the second zone is the base zone of the transistor.

16. A semiconductor device as claimed in claim 3, wherein means are present for applying such potentials to the first zone and the second zone so that the first p-n junction is biased in a reverse direction at least temporarily.

* * * * *

PO-1050
(5/69)

UNITED STATES PATENT OFFICE
CERTIFICATE OF CORRECTION

Patent No. 3,763,406 Dated October 2, 1973

Inventor(s) CORNELIS A. BOSSELAAR

It is certified that error appears in the above-identified patent and that said Letters Patent are hereby corrected as shown below:

Column 3, line 1, after "The" insert --further--.

Column 6, line 21, change "29" to --19--.

Column 7, line 2, change "10 µum " to --10 µm-- ;

lines 3 and 7, change "at/ccm$^3$" to --at/cm$^3$--;

line 6, change "6 µum" to --6 µm--;

line 9, change "1 µum" to --1 µm--;

line 10, change "0.5 µum" to --0.5 µm--.

Signed and sealed this 16th day of April 1974.

(SEAL)
Attest:

EDWARD M. FLETCHER, JR.
Attesting Officer

C. MARSHALL DANN
Commissioner of Patents